United States Patent
Dunga et al.

(10) Patent No.: US 9,142,305 B2
(45) Date of Patent: Sep. 22, 2015

(54) SYSTEM TO REDUCE STRESS ON WORD LINE SELECT TRANSISTOR DURING ERASE OPERATION

(71) Applicant: SANDISK TECHNOLOGIES INC., Milpitas, CA (US)

(72) Inventors: Mohan Vamsi Dunga, Santa Clara, CA (US); Man Mui, Santa Clara, CA (US); Masaaki Higashitani, Cupertino, CA (US); Fumiaki Toyama, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 165 days.

(21) Appl. No.: 13/915,103

(22) Filed: Jun. 11, 2013

(65) Prior Publication Data

US 2014/0003150 A1 Jan. 2, 2014

Related U.S. Application Data

(60) Provisional application No. 61/665,878, filed on Jun. 28, 2012.

(51) Int. Cl.
| | |
|---|---|
| *G11C 16/16* | (2006.01) |
| *G11C 16/14* | (2006.01) |
| *G11C 8/08* | (2006.01) |
| *G11C 11/56* | (2006.01) |
| *G11C 16/08* | (2006.01) |

(52) U.S. Cl.
CPC *G11C 16/16* (2013.01); *G11C 8/08* (2013.01); *G11C 11/5635* (2013.01); *G11C 16/08* (2013.01); *G11C 16/14* (2013.01)

(58) Field of Classification Search
CPC .................................. G11C 16/14; G11C 16/16
See application file for complete search history.

(56) References Cited

U.S. PATENT DOCUMENTS

| | | |
|---|---|---|
| 5,280,454 A | 1/1994 | Tanaka |
| 6,160,737 A | 12/2000 | Hsu et al. |
| 6,222,770 B1 | 4/2001 | Roohparvar |
| 6,344,993 B1 | 2/2002 | Harari et al. |
| 6,839,283 B1 | 1/2005 | Futatsuyama |
| 6,859,397 B2 | 2/2005 | Lutze et al. |
| 6,917,542 B2 | 7/2005 | Chen et al. |
| 7,057,915 B2 | 6/2006 | Futatsuyama |
| 7,177,173 B2 | 2/2007 | Fatatsuyama |
| 7,263,000 B2 | 8/2007 | Hazama |
| 7,403,427 B2 * | 7/2008 | Chen ........................ 365/185.29 |
| 7,450,433 B2 | 11/2008 | Wan et al. |
| 7,499,325 B2 | 3/2009 | Doyle |
| 7,535,766 B2 | 5/2009 | Ito |

(Continued)

OTHER PUBLICATIONS

Restriction Requirement dated Dec. 3, 2010, U.S. Appl. No. 12/406,014, filed Mar. 17, 2009.

(Continued)

*Primary Examiner* — Vanthu Nguyen
(74) *Attorney, Agent, or Firm* — Vierra Magen Marcus LLP

(57) ABSTRACT

A system for erasing a non-volatile storage system that reduces the voltage across the word line select transistors which interface between the word lines and global control lines. The use of the lower voltage across the word line select transistors allows for the word line select transistors to be made smaller. The use of smaller components allows the non-volatile storage system to include more memory cells, thereby providing the ability to store more data.

29 Claims, 13 Drawing Sheets

(56) References Cited

U.S. PATENT DOCUMENTS

| | | | |
|---|---|---|---|
| 7,724,577 B2 * | 5/2010 | Goda et al. | 365/185.18 |
| 7,778,086 B2 | 8/2010 | Yu | |
| 8,004,900 B2 | 8/2011 | Dutta | |
| 8,059,469 B2 | 11/2011 | Lee | |
| 2003/0007389 A1 | 1/2003 | Ohtani et al. | |
| 2003/0095439 A1 | 5/2003 | San et al. | |
| 2005/0141284 A1 | 6/2005 | Fatatsuyama | |
| 2006/0140012 A1 | 6/2006 | Wan et al. | |
| 2006/0221708 A1 | 10/2006 | Higashitani et al. | |
| 2007/0115729 A1 | 5/2007 | Chen | |
| 2007/0255893 A1 | 11/2007 | Takeuchi | |
| 2008/0037330 A1 | 2/2008 | Park et al. | |
| 2008/0137409 A1 | 6/2008 | Nakamura et al. | |
| 2008/0151644 A1 | 6/2008 | Park et al. | |
| 2008/0181020 A1 | 7/2008 | Yu et al. | |
| 2009/0010071 A1 | 1/2009 | Lee | |
| 2010/0238730 A1 | 9/2010 | Dutta et al. | |
| 2011/0149659 A1 | 6/2011 | Goda | |
| 2011/0267888 A1 | 11/2011 | Dutta | |

OTHER PUBLICATIONS

Response to Restriction Requirement dated Dec. 21, 2010, U.S. Appl. No. 12/406,014, filed Mar. 17, 2009.

Office Action dated Jan. 12, 2011, U.S. Appl. No. 12/406,014, filed Mar. 17, 2009.

Response to Office Action dated Apr. 12, 2011, U.S. Appl. No. 12/406,014, filed Mar. 17, 2009.

Notice of Allowance and Fee(s) Due dated Jun. 23, 2011, U.S. Appl. No. 12/406,014, filed Mar. 17, 2009.

Office Action dated Oct. 28, 2011, U.S. Appl. No. 13/181,750, filed Jul. 13, 2011.

Response to Office Action dated Jan. 26, 2012, U.S. Appl. No. 13/181,750, filed Jul. 13, 2011.

Office Action dated Apr. 12, 2012, U.S. Appl. No. 13/181,750, filed Jul. 13, 2011.

Response to Office Action dated Jul. 10, 2012, U.S. Appl. No. 13/181,750, filed Jul. 13, 2011.

Office Action dated Mar. 25, 2013, U.S. Appl. No. 13/181,750, filed Jul. 13, 2011.

Response to Office Action dated Apr. 11, 2013, U.S. Appl. No. 13/181,750, filed Jul. 13, 2011.

PCT International Search Report dated Oct. 7, 2013, PCT Patent Application No. PCT/US2013/045585.

PCT Written Opinion of the International Searching Authority dated Oct. 7, 2013, PCT Patent Application No. PCT/US2013/045585.

* cited by examiner

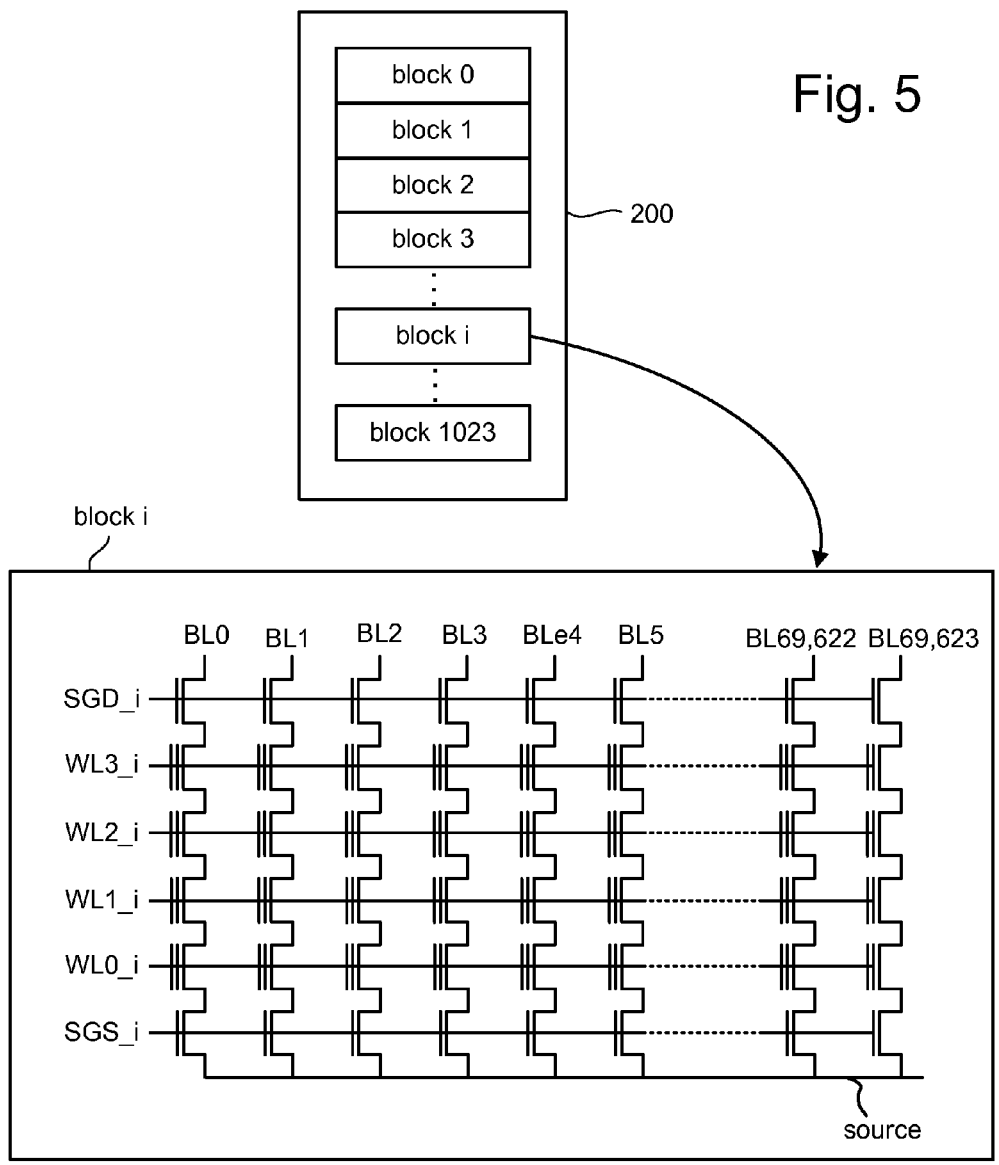

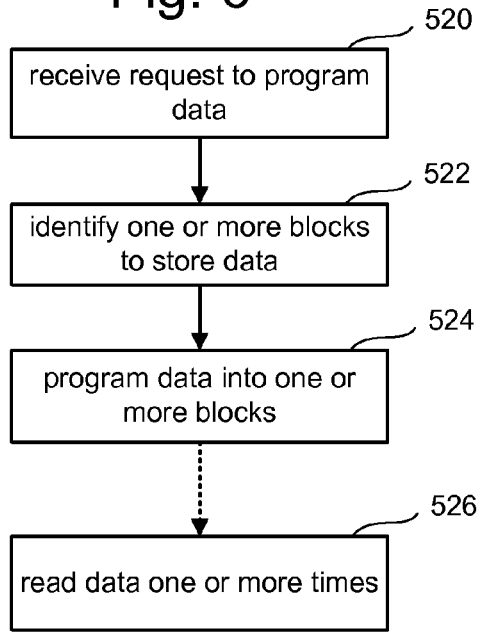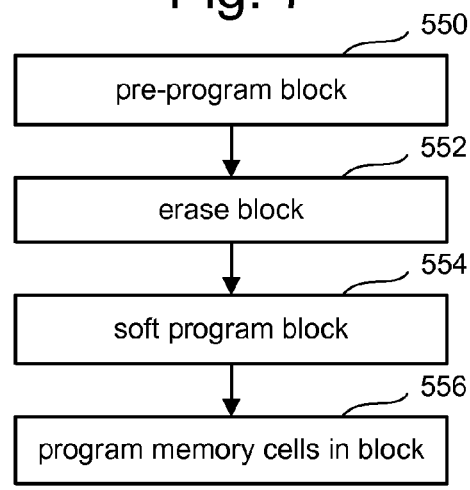

unselected selected unselected selected

Fig. 17
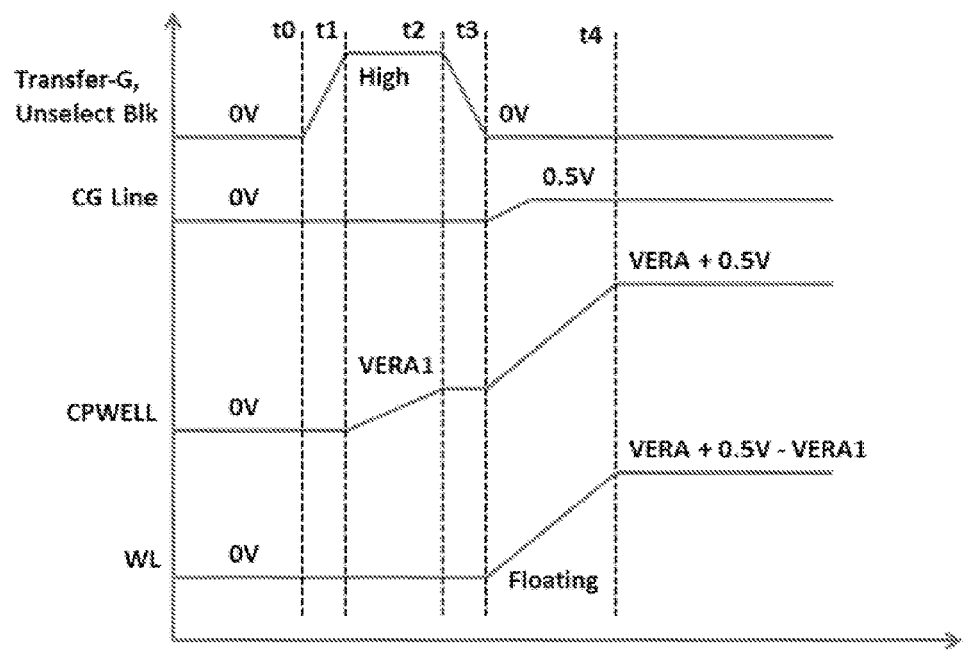
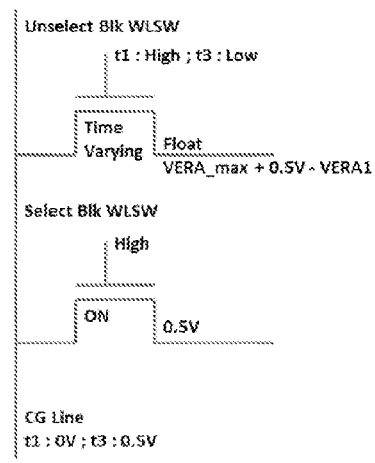
Fig. 18

US 9,142,305 B2

SYSTEM TO REDUCE STRESS ON WORD LINE SELECT TRANSISTOR DURING ERASE OPERATION

This application claims the benefit of Provisional Application 61/665,878, "System To Reduce Stress On Word Line Select Transistor During Erase Operation," filed on Jun. 28, 2012, incorporated herein by reference in its entirety.

BACKGROUND OF THE INVENTION

1. Field of the Invention

The present invention relates to technology for non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line BL is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary or two-state device.

A multi-state flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

BRIEF DESCRIPTION OF THE DRAWINGS

FIG. 5 is a block diagram depicting one embodiment of a memory array.
FIG. 6 is a flow chart describing one embodiment of a process for programming.
FIG. 7 is a flow chart describing one embodiment of a process for programming data into a block of memory cells.
FIG. 17 is a timing diagram describing an erase operation.
FIG. 18 depicts word line switches.

DETAILED DESCRIPTION

In order to increase the amount of data that can be stored by a non-volatile storage system, it is advantageous to shrink the size of the components of the system so that there is room to fit more memory cells. In some cases, the size of a transistor (or other component) cannot be made smaller because that transistor (or other component) must be designed to tolerate large voltages. One example of such components that needs to be able to tolerate a large voltage are the transistors that interface between the word lines and the global control lines that supply voltages to the word lines. These transistors are referred to as the word line switches, and are subjected to large voltages during the erase and program process. The word line switch size is determined by the voltages they are subjected to during the erase and program process. The technology described herein provides a system for reducing the voltage across word line switches during the erase process so that the word line switches can be made smaller. The use of smaller components allows the non-volatile storage system to include more memory cells, thereby providing the ability to store more data.

One embodiment for reducing the voltage across the word line switches includes ramping up a well to a first voltage, ramping up the well to an erase voltage plus a small voltage (where the small voltage can be 0V), holding word lines for one or more selected blocks at the small voltage (or another low voltage or at ground), floating and causing word lines for unselected blocks to charge up to the erase voltage plus the small voltage minus the first voltage, and erasing memory cells of selected blocks in response to the well at the erase voltage plus the small voltage, without erasing memory cells of unselected blocks.

Figure 1:
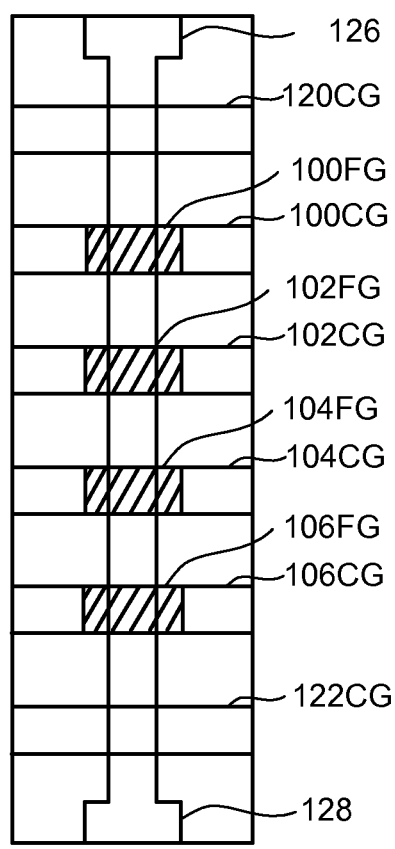
FIG. 1 is a top view of a NAND string.
Figure 2:
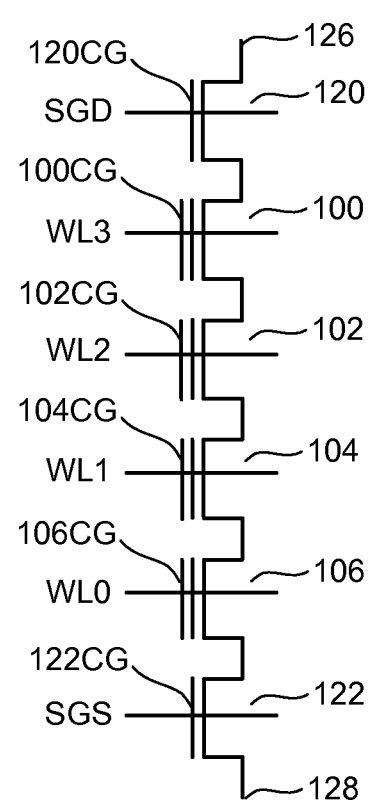
FIG. 2 is an equivalent circuit diagram of the NAND string.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between (drain side) select gate 120 and (source side) select gate 122. Select gate 120 connects the NAND string to a bit line BL via bit line BL contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100cg and floating gate 100FG. Transistor 102 includes control gate 102cg and a floating gate 102FG. Transistor 104 includes control gate 104cg and floating gate 104FG. Transistor 106 includes a control gate 106cg and a floating gate 106FG. Control gate 100cg is connected to word line WL3, control gate 102cg is connected to word line WL2, control gate 104cg is connected to word line WL1, and control gate 106cg is connected to word line WL0.

Note that although FIGS. 1 and 2 show four memory cells in the NAND string, the use of four memory cells is only provided as an example. A NAND string can have less than four memory cells or more than four memory cells. For example, some NAND strings will have 128 memory cells or more. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line BL by its drain select gate controlled by select line SGD. Each bit line BL and the respective NAND string(s) that are connected to that bit line BL via a bit line BL contact comprise the columns of the array of memory cells. bit line BLs are shared with multiple NAND strings. Typically, the bit line BL runs on top of the NAND strings in a direction perpendicular to the word lines and is connected to a sense amplifier.

In some embodiments, the NAND strings are implemented in a triple well structure comprising a P substrate, a N-well in the P substrate and a P-well in the N-well. The NAND strings on the top surface of the P-well. Other embodiments can include the NAND strings implemented on a N-Well, which is in a P-well, which is in a N substrate.

Relevant examples of NAND type flash memories and their operation are provided in the following U.S. Patents/Patent Applications, all of which are incorporated herein by reference in their entirety: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices, in addition to NAND flash memory, can also be used to implement the new technology described herein. For example, a TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Other types of non-volatile memory technologies can also be used.

Figure 3:
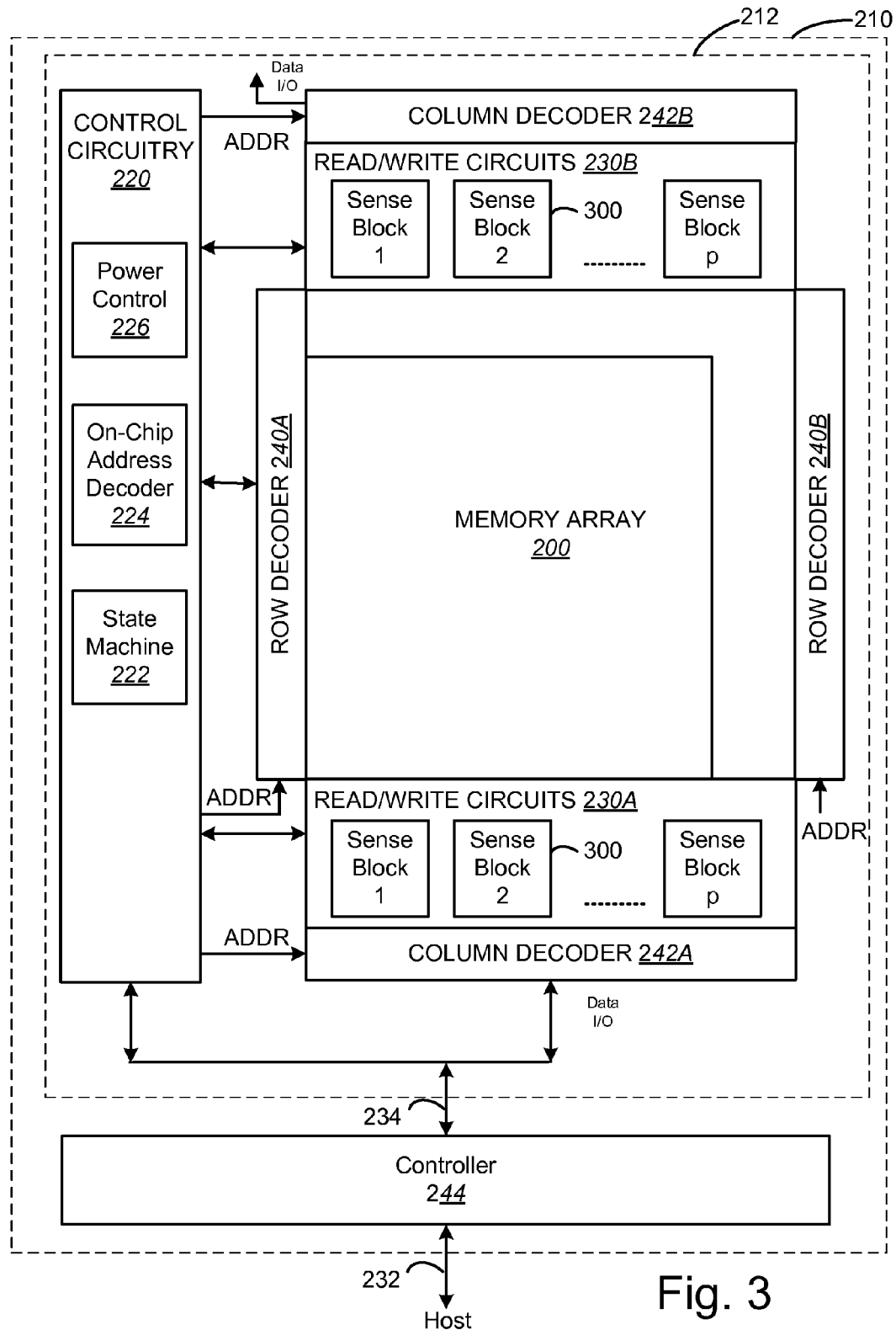
FIG. 3 is a block diagram of a non-volatile memory system.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit line BLs via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. Some memory systems may include multiple dies 212 in communication with Controller 244.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit line BLs during memory operations. In one embodiment, power control module 226 includes one or more charge pumps that can create voltages larger than the supply voltage. Control circuitry 220, power control 226, decoder 224, state machine 222, decoders 240 A/B & 242A/B, the read/write circuits 230A/B and the controller 244, collectively or separately, can be referred to as one or more control circuits.

Figure 4:
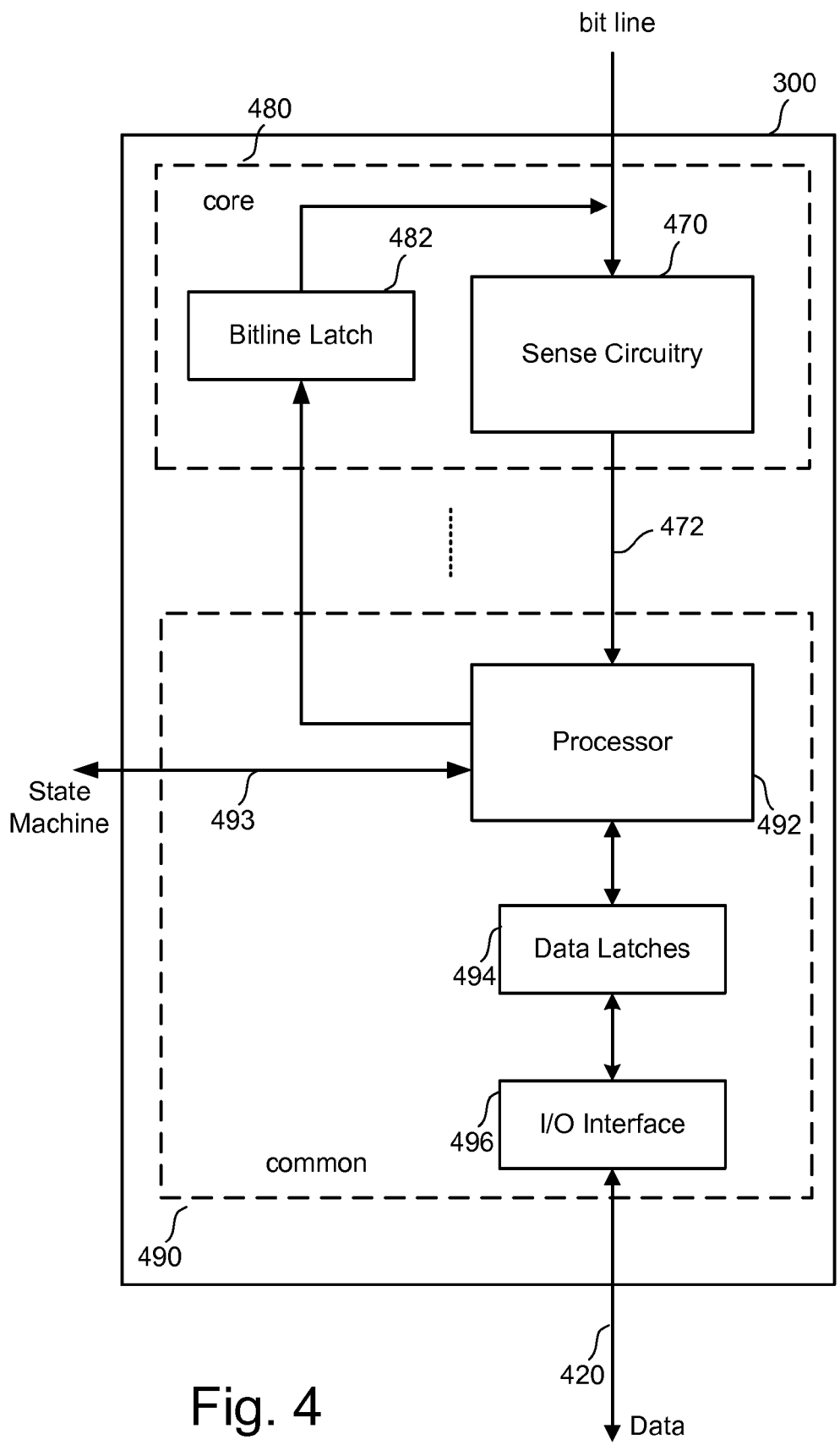
FIG. 4 is a block diagram depicting one embodiment of a sense block.

FIG. 4 is a block diagram of an individual sense block 300 partitioned into a core portion, referred to as a sense module 480, and a common portion 490. In one embodiment, there will be a separate sense module 480 for each bit line BL and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line BL is above or below a predetermined level. In some embodiments, sense module 480 includes a circuit commonly referred to as a sense amplifier. Sense module 480 also includes a bit line BL latch 482 that is used to set a voltage condition on the connected bit line BL. For example, a predetermined state latched in bit line BL latch 482 will result in the connected bit line BL being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line BL latch 482 serves double duty, both as a latch for latching the output of the sense module 480 and also as a bit line BL latch as described above.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit line BLs such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 420. The program operation, under the control of the state machine, comprises a series of programming voltage pulses (with increasing magnitudes) concurrently applied to the control gates of the addressed memory cells to that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line BL latch 482 so as to cause the bit line BL to be pulled to a state designating program inhibit. This inhibits the memory cell coupled to the bit line BL from further programming even if it is subjected to programming pulses on its control gate. In other embodiments the processor initially loads the bit line BL latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Application Pub. 2006/0221692, titled "Compensating for Coupling During Read Operations of Non-Volatile Memory,"

Inventor Jian Chen, filed on Apr. 5, 2005; and (5) U.S. Patent Application Pub. 2006/0158947, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

FIG. 5 depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together. Other embodiments can use different units of erase.

As one example, the NAND flash EEPROM depicted in FIG. 5 is partitioned into 1,024 blocks. However, more or less than 1024 blocks can be used. In each block, in this example, there are 69,624 columns corresponding to bit line BLs BL0, BL1, ... BL69,623. In one embodiment, all of the bit line BLs of a block can be simultaneously selected during read and program operations. Memory cells along a common word line and connected to any bit line BL can be programmed (or read) at the same time (e.g., concurrently). In another embodiment, the bit line BLs are divided into even bit line BLs and odd bit line BLs. In an odd/even bit line BL architecture, memory cells along a common word line and connected to the odd bit line BLs are programmed at one time, while memory cells along a common word line and connected to even bit line BLs are programmed at another time.

FIG. 5 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line BL via a drain select gate (connected to select gate drain line SGD), and another terminal is connected to the source line via a source select gate (connected to select gate source line SGS).

Each block is typically divided into a number of pages. In one embodiment, a page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. The controller calculates the ECC when data is being programmed into the array, and also checks it when data is being read from the array. In some embodiments, the state machine, controller, or other component can calculate and check the ECC. In some alternatives, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. In one embodiment, each word line of a block is associated with one page. In another embodiment, each word line of a block is associated with 3 pages. In other embodiments, the word lines can be associate with other numbers of pages.

Some memory cells are slower to program or erase than others because of manufacturing variations among those memory cells, because those cells were previously erased to a lower threshold voltage than others, because of uneven wear among the cells within a page, or other reasons. And, of course, some memory cells cannot be programmed or erased whatsoever, because of a defect or other reason. Additionally, some memory cells program fast and can be over programmed, which may also cause an error. As mentioned above, error correction coding provides the capability of tolerating some number of failed cells, while still maintaining the memory as usable. In some applications, a page of data is programmed by repeatedly applying programming pulses until all memory cells on that page verify to the desired programmed state. In some implementation, programming and erasing time is saved by terminating the sequence of programming or erasing pulses when the number of error memory cells that are not yet fully programmed or erased is fewer than the number of bits that are correctable.

FIG. 6 is a flow chart describing one embodiment of a process for operating non-volatile storage. In step 520, a request for programming is received from the Host, the Controller or other entity. In step 522, the Controller (or state machine or other entity) will determine which set of one or more blocks to store the data. In step 524, the data received for the request is programmed into one or more blocks of memory cells. In step 526, the data can be read. The dashed line between steps 524 and 526 indicates that there can be an unpredictable amount of time between programming and reading.

FIG. 7 is a flow chart describing a process for programming a block of memory. The process of FIG. 7 is performed one or more times during step 524 of FIG. 6. In one example implementation, memory cells are pre-programmed in order to maintain even wear on the memory cells (step 550). In one embodiment, the memory cells are preprogrammed to the highest data state, a random pattern, or any other pattern. In some implementations, pre-programming need not be performed. Some embodiments do not implement pre-programming.

In step 552, memory cells are erased (in blocks or other units) prior to programming. Memory cells are erased in one embodiment by raising the p-well to an erase voltage Vera (e.g., 20-24 volts) for a sufficient period of time and grounding the word lines of a selected block while the source and bit line BLs are floating. In blocks that are not selected to be erased, word lines are floated. Due to capacitive coupling, the unselected word lines, bit line BLs, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by a Fowler-Nordheim tunneling mechanism. As electrons are transferred from the floating gate to the p-well region, the threshold voltage of a selected cell is lowered. Erasing can be performed on the entire memory array, on individual blocks, or another unit of memory cells. In one embodiment, after erasing the memory cells, all of the erased memory cells in the block will be in state S0 (discussed below). One implementation of an erase process includes applying several erase pulses to the p-well and verifying between erase pulses whether the NAND strings are properly erased.

In step 554, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution. In step 556, the memory cells of the block are programmed. The programming can be performed in response to a request to program from the host, or in response to an internal process. After programming, the memory cells of the block can be read. Many different read processes known in the art can be used to read data. In some embodiments, the read process includes using ECC to correct errors. The data that is read is output to the hosts that requested the read operation. The ECC process can be performed by the state machine, the controller or another device. The erase-program cycle can happen many times without or independent of reading, the read process can occur many times without or independent of programming and the read process can happen any time after programming. The process of FIG. 7 can be performed at the direction of the state machine using the various circuits described above. In other embodiments, the process of FIG. 7 can be performed at the direction of the Controller using the various circuits described above.

Figure 8:
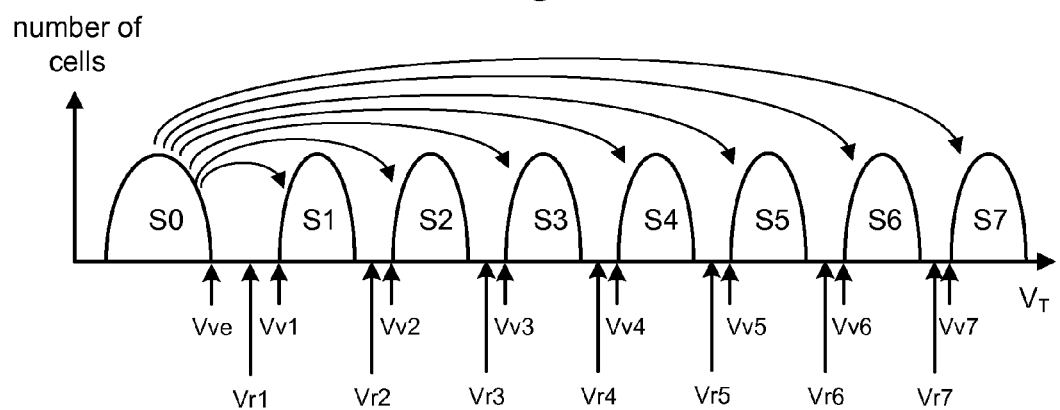
FIG. 8 depicts an example set of threshold voltage distributions and describes a process for programming non-volatile memory.

At the end of a successful programming process (with verification), the threshold voltages of the memory cells should be within one or more distributions of threshold voltages for programmed memory cells or within a distribution of threshold voltages for erased memory cells, as appropriate. FIG. 8 illustrates example threshold voltage distributions for the memory cell array when each memory cell stores three bits of data. Other embodiments, however, may use more or less than three bits of data per memory cell (e.g., such as three bits of data per memory cell).

In the example of FIG. 8, each memory cell stores three bits of data; therefore, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit line BLs, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 8.

FIG. 8 shows a set of verify target levels Vv1, Vv2, Vv3, Vv4, Vv5, Vv6, and Vv7. These verify levels are used as comparison levels (also known as target levels) during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 8 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine which states that memory cells are storing data for.

In general, during verify operations and read operations, the selected word line is connected to a voltage, a level of which is specified for each read operation (e.g., see read compare levels Vr1, Vr2, Vr3, Vr4, Vr5, Vr6, and Vr7, of FIG. 8) or verify operation (e.g. see verify target levels Vv1, Vv2, Vv3, Vv4, Vv5, Vv6, and Vv7 of FIG. 8) in order to determine whether a threshold voltage of the concerned memory cell has reached such level. After applying the word line voltage, the conduction current of the memory cell is sensed to determine whether the memory cell turned on in response to the voltage applied to the word line. If the conduction current is sensed to be greater than a certain value, then it is assumed that the memory cell turned on and the voltage applied to the word line is greater than the threshold voltage of the memory cell. If the conduction current is not sensed to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to sense/measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line BL. The voltage on the bit line BL is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The read and verify operations described above are performed according to techniques known in the art. Thus, many of the details explained can be varied by one skilled in the art. Other read and verify techniques known in the art can also be used.

Figure 9:
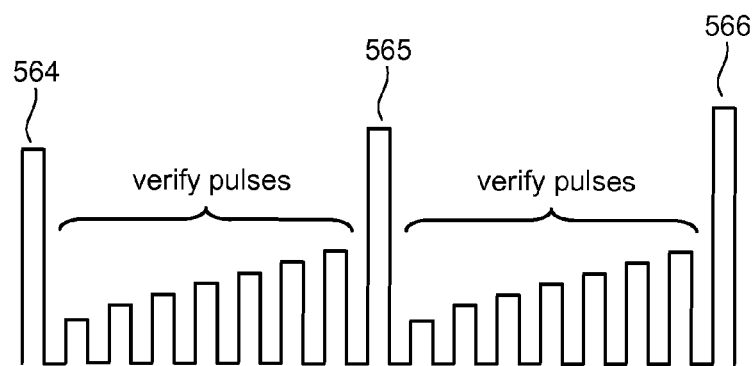
FIG. 9 depicts three programming pulses, and the verify pulses applied between the programming pulses.

In some embodiments, the program voltage applied to the control gate includes a series of pulses that are increased in magnitude with each successive pulse by a predetermined step size (e.g. 0.2v, 0.3v, 0.4v, or others). Between pulses, some memory systems will verify whether the individual memory cells have reached their respective target threshold voltage ranges. For example, FIG. 9 shows a portion of a signal applied to the control gates of a plurality of memory cells connected to a common word line. FIG. 9 shows programming pulses 564, 565 and 566, with a set of verify pulses between the programming pulses. When performing full sequence programming in one embodiment, the verification process between programming pulses will test for each of the threshold voltage distribution (data states) S1-S7. Therefore, FIG. 9 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 8 have reached Vv2, there is no reason to verify at Vv7. More information about intelligent verification schemes that skip verification for one or more states can be found in the following patent documents which are incorporated herein by reference in their entirety: U.S. Pat. No. 7,073,103; U.S. Pat. No. 7,224,614; U.S. Pat. No. 7,310,255; U.S. Pat. No. 7,301,817; U.S. Patent App. 2004/0109362; and U.S. Patent App. 2009/0147573.

Figure 10A:
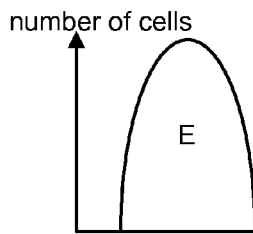
FIGS. 10A-E show various threshold voltage distributions and describe a process for programming non-volatile memory.
Figure 10B:
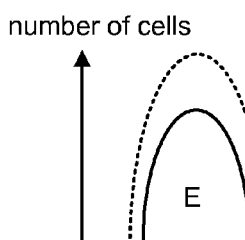

FIG. 8 shows a programming process that includes one phase where all memory cells connected to the same word line are programmed concurrently during that one phase. FIGS. 10A-E illustrates a multi-phase programming approach. In this embodiment, the programming process includes three phases. Prior to programming, the memory cells are erased so that all memory cells connected to a common word line are in an erased threshold voltage distribution E, as depicted in FIG. 10A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 10B. Memory cells being programmed to intermediate state IM are programmed to a target threshold voltage of VvIM.

Figure 10C:
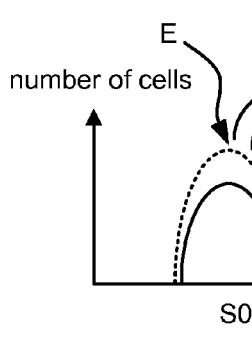
Figure 10D:
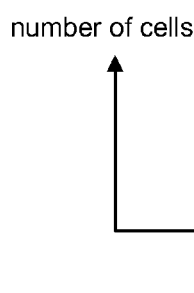
Figure 10E:
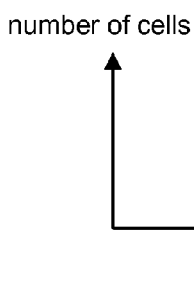

During the second phase of the programming process of FIGS. 10A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 10C.

As can be seen in FIG. 10C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third phase of programming, each of data states S1-S7 are tightened so that they no longer overlap with neighboring states. This is depicted graphically by FIG. 10D. The final result of the three phrase programming process is depicted in step 10E, which shows data states S0-S7. In some embodiments, data state S0 is wider than data states S1-S7.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

Figure 11:
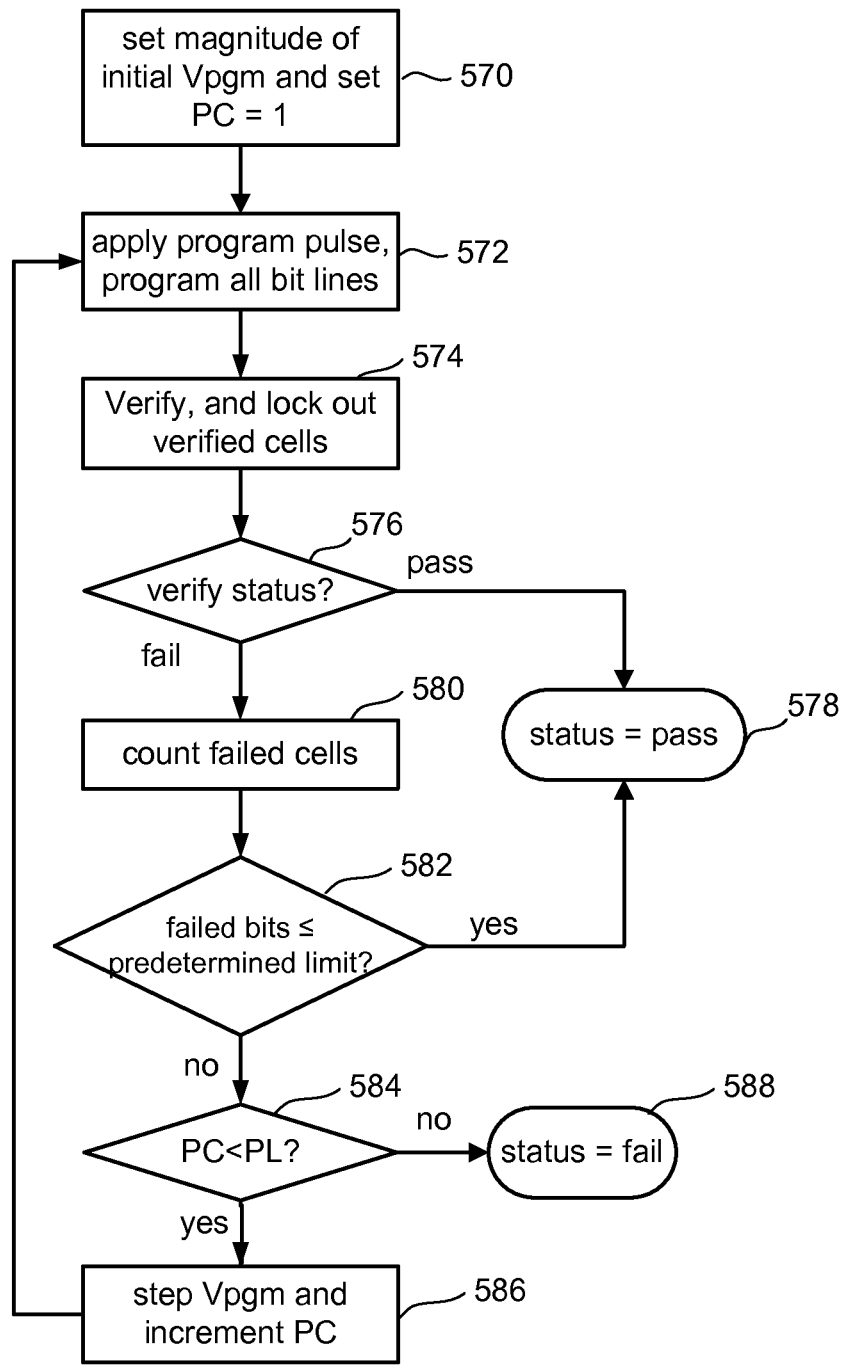
FIG. 11 is a flow chart describing one embodiment of a process for programming non-volatile memory.

FIG. 11 is a flow chart describing one embodiment of a process for performing programming on memory cells connected to a common word line to one or more targets (e.g., data states or threshold voltage ranges). The process of FIG. 11 can be performed one or multiple times during step 556 of FIG. 7. For example, the process of FIG. 11 can be used to program memory cells (e.g., full sequence programming) from state S0 directly to any of states S1-S7. Alternatively, the process of FIG. 11 can be used to perform one or each of the phases of the process of FIG. 10A-E. For example, when performing the process of FIG. 10A, the process of FIG. 11 is used to implement the first phase that includes programming some of the memory cells from state E to state IM. The process of FIG. 11 can then be used again to implement the second phase that includes programming some of the memory cells from state E to states S1-S3 and from state IM to states S4-S7. The process of FIG. 11 can be used again to adjust states S1-S7 in the third phase (see FIG. 10D). The process of FIG. 11 can also be used with other multi-phase programming processes.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. In step 570 of FIG.

11, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line BL is grounded. On the other hand, if the memory cell should remain at its current threshold voltage, then the corresponding bit line BL is connected to Vdd to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target levels to perform one or more verify operations. In one embodiment, the verification process is performed by applying the testing whether the threshold voltages of the memory cells selected for programming have reached the appropriate verify compare voltage (Vv1, Vv2, Vv3, Vv4, Vv5, Vv6, and Vv7).

In step 576, it is determined whether all the memory cells have reached their target threshold voltages (pass). If so, the programming process is complete and successful because all selected memory cells were programmed and verified to their target states. A status of "PASS" is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of cells that have failed the verify process. This counting can be done by the state machine, the controller, or other logic. In one implementation, each of the sense block 300 (see FIG. 3) will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in United States Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed.

In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If number of failed memory cells is not less than the predetermined limit, than the programming process continues at step 584 and the program counter PC is checked against the program limit value (PL). Examples of program limit values include 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line.

As discussed above, during erase process the p well receives an erase voltage, referred to as Vera (e.g. approximately 20 volts). In one embodiment, word lines for the block selected to be erased will be at zero volts or a small voltage that is near zero volts (e.g., 0.5 volts). Word lines for unselected blocks will be floated so that they couple to the p well and will raise up toward Vera. In those embodiments where the word lines for selected blocks are at 0.5 volts, then the p well (and, therefore, the word lines for unselected blocks) will be raised to Vera+0.5 volts.

Figure 12:
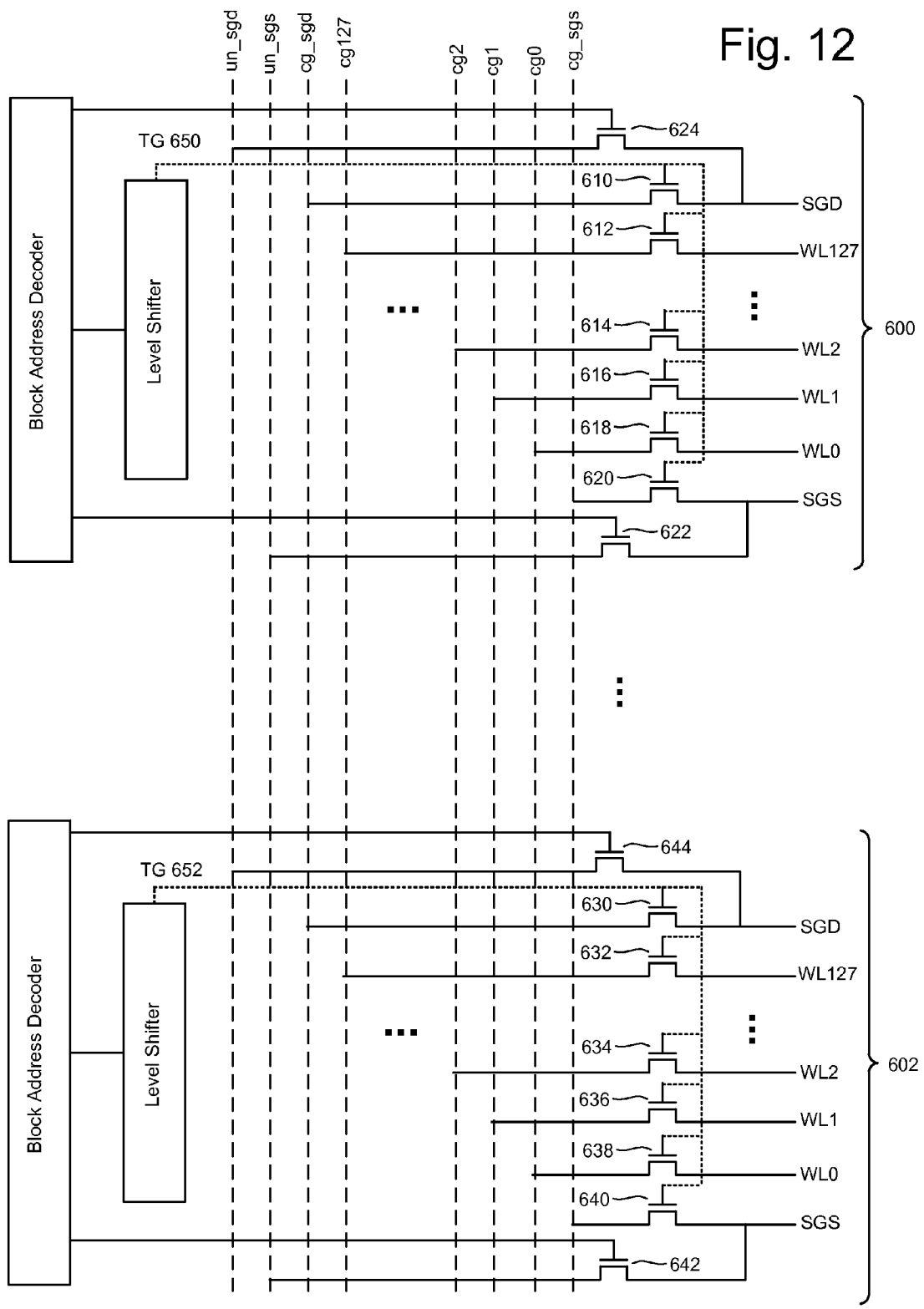
FIG. 12 is a block diagram depicting the connection of word lines to global control lines for multiple blocks of memory cells.

FIG. 12 is a block diagram depicting the connection of word lines to global control lines from multiple blocks of memory cells. For this example, FIG. 12, assumes 128 word lines in a block (and 128 data memory cells in a NAND string). There are 132 global control lines including un_sgd, un_sgs, cg_sgd, cg127, . . . cg2, cg1, cg0, cg_sgs (depicted as dashed lines to make it easier to read FIG. 12). These global control lines will receive voltages from charge pumps or other voltage providing circuits and transport those voltages to the word lines for selected blocks of memory cells. For example, cg0 can be selectively connected to WL0 of any block, cg1 can be selectively connected to WL1 of any block, . . . cg127 can be selectively connected to WL127 of any block of memory cells. The signals cg_sgs and cg_sgd connect to sgs and sgd, respectively, of any selected block. The signals un_sgd and un_sgs are used to prevent unselected blocks from conducting any current, as will be discussed below.

FIG. 12 shows word lines WL0, WL1, WL2, . . . WL127 for block 600 and word lines WL0, WL1, WL2, . . . WL127 for block 602. Note that the memory system will have more than two blocks (as implied by the ellipsis); however, only two blocks are depicted to make the drawing readable. Each of the blocks include a set of word line switches that interface between the word lines (and control lines SGS and SGD) and the global control lines. For example, block 600 includes word line switches 610, 612, . . . , 614, 616, 618 and 620. Block 602 includes word line switches 630, 632, . . . , 634, 636, 638 and 640. In one embodiment, each of the word line switches are transistors. In other embodiments, other types of switches can be used. The drain of each of the word line switches are connected to the respective word line while the source of the respective word line switches are connected to the respective global control lines. For example, word line switch 614 has its source connected to cg2 and its drain connected to WL2. The gates of the word line switches 610-620 of block 600 are all connected to the same gate line TG 650. Word line switches 630-640 of block 602 all have their gates connected to the same gate line TG 652. Gate line TG 650 and gate line TG652 are depicted as dotted lines only for purposes of making FIG. 12 easier to read.

Row decoders 240A and 240B (see FIG. 3) include the Block Address Decoders depicted in FIG. 12, which decode whether their respective blocks are selected for the memory operation (e.g. erase operation). If so, the respective Block Address Decoder will instruct the connected Level Shifter to generate the appropriate signals on the TG line. If block 600 is selected for erase, then the appropriate voltages will be placed on the global control lines (e.g. cg0-cg127) and a high voltage is asserted on TG 650 so that the word line switches 610-620 turn on and connect the word lines to the appropriate global control lines. If block 602 is not selected for being erased, then level shifter will assert zero volts on TG line 652 (or another small voltage) so that the word line switches 630-640 all remain off and the word lines are floated (and electrically isolated from the global control lines (cg0-cg127).

FIG. 12 shows transistor 622 switching between un_sgs and the signal SGS. This is used in the read process and the program process when block 600 is not selected to force zero volts on SGS. Similarly, when block 600 is not selected during the Read and Program processes, transistor 624 is turned on so that zero volts can be applied from un_sgd to SGD. Transistor 644 performs the same function for block 602 that transistor 624 performs for block 600. Transistor 642 performs the same function for block 602 that transistor 622 performs for block 600.

Figure 13A:
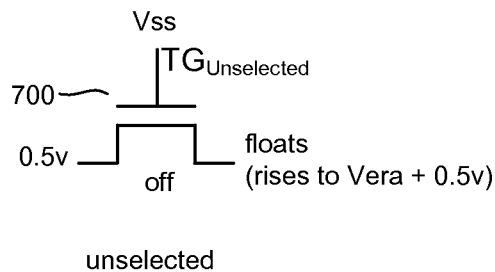
FIG. 13A depicts a word line switch in a block that is not selected to be erased.

FIG. 13A shows the signals on each of the terminals of a word line switch 700 during an erase operation for an unselected block. In the example where block 602 is unselected, then transistor 700 can be any of transistors 632-638. As can be seen, the TG line will apply Vss (e.g., zero volts) to the gate of transistor 700 so that transistor 700 remains off. In this manner, the drain is cut off from the source such that the drain (which in this case is the word line) floats. As will be explained below, because the word line is floating, it will couple to the p well and rise to Vera+0.5 volts.

Figure 13B:
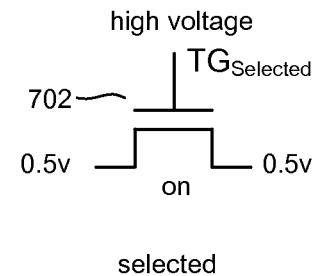
FIG. 13B depicts a word line switch in a block that is selected to be erased.

FIG. 13B shows an example word line switch 702 for a block that is selected for erase. For example, transistor 702 can be any of word line switches 612-618. As can be seen, the TG line for the selected block will provide a high voltage to the gate of transistor 702 in order to turn on transistor 702. As a result, the voltage on the source (e.g., 0.5 volts) is transferred to the drain. Therefore, the word line for the selected block will be at 0.5 volts.

Figure 14:
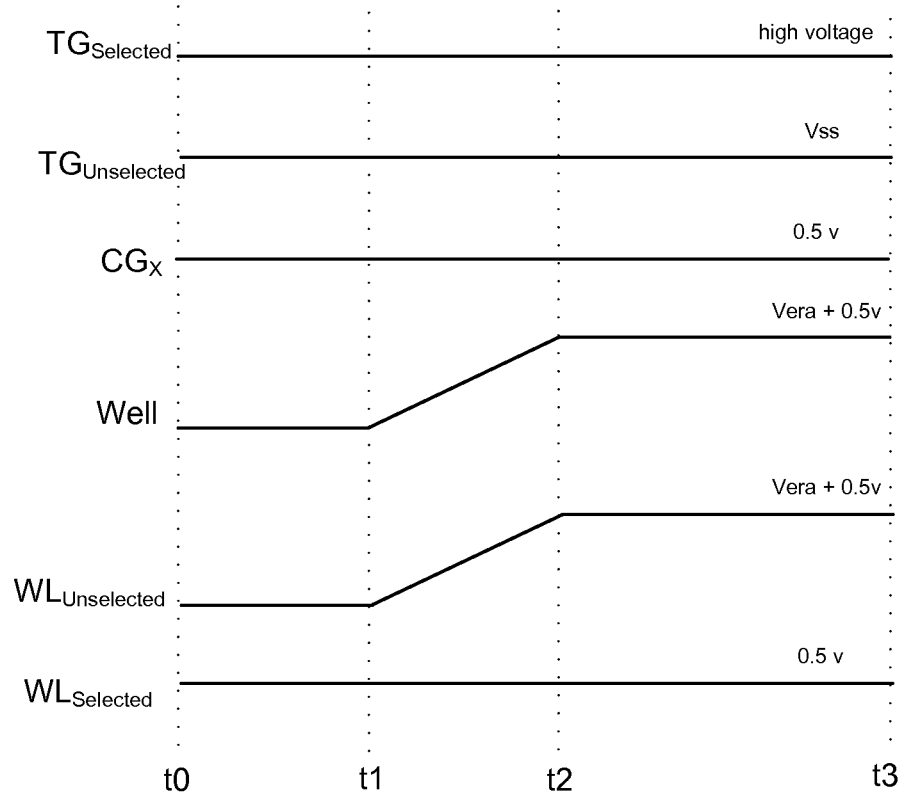
FIG. 14 is a timing diagram describing an erase operation.

FIG. 14 is a timing diagram depicting the operation of the structure of FIGS. 12, 13A and 13B during an erase operation. During the depicted time period (t0-t3) the TG line for a selected block is at a high voltage (e.g., four to 15 volts), the TG lines for unselected blocks is at Vss (e.g. zero volts), and all of the global control lines ($CG_x$) are at 0.5 volts. At time t1, the Well is raised from zero volts until t2, when the Well reaches Vera+0.5 volts. In one embodiment, the Well is a p well. However, in other implementations, the Well can be an n well. The word lines for the selected blocks ($WL_{selected}$), will be at 0.5 volts between t0 and t3, as described above with respect to FIG. 13B. Because the word lines for unselected blocks ($WL_{Unselected}$) are floating, they will rise at time t1 due to capacitive coupling with the Well. The unselected word lines will continue to rise until t2, when they reach Vera+0.5 volts.

In the embodiment of FIGS. 13A, 13B and 14, the word line switches for blocks not selected for erasing will have a large voltage across the transistor. In the specific example described above, the source of the transistor is at 0.5 volts and the drain of the transistor is at Vera+0.5 volts; therefore, the transistors will see Vera across the transistor. Also, the drain junction (WL-side junction) sees large voltage of Vera+0.5V which makes the drain junction breakdown and Gate Induced Drain Leakage (GIDL) worse. To prevent junction breakdown at WL-side junction and to prevent Gate Induced Drain Leakage (GIDL), the transistor must be made larger. Since there are many word line switches, making this transistor larger will use up more room on the semiconductor die than desirable.

Figure 15A:
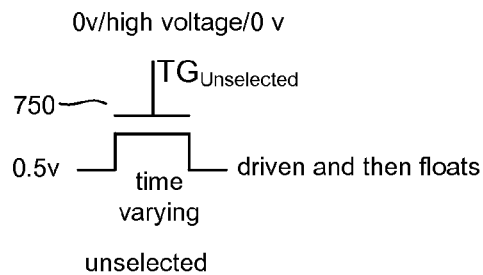
FIG. 15A depicts a word line switch in a block that is not selected to be erased.
Figure 15B:
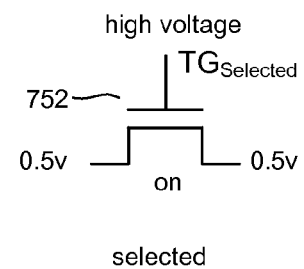
FIG. 15B depicts a word line switch in a block that is selected to be erased.
Figure 16:
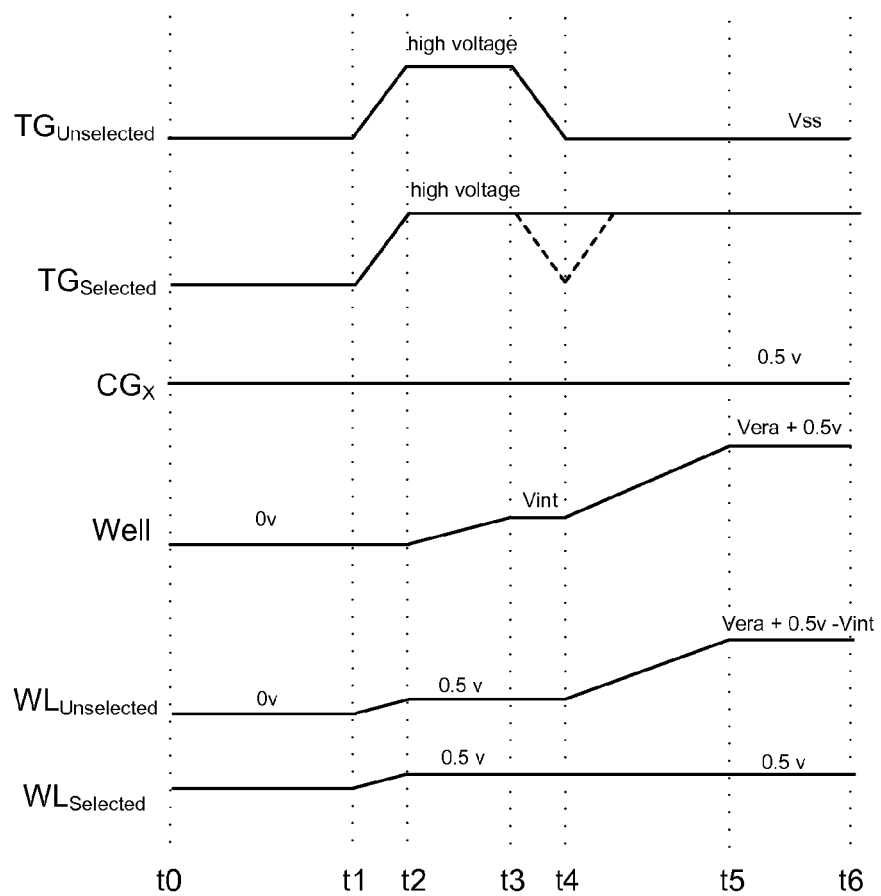
FIG. 16 is a timing diagram describing an erase operation.

FIGS. 15A, 15B and 16 propose an embodiment for erasing that will lower the voltage across the word line switches; thereby, enabling the word line switches to be made smaller. Once the word line switches are made smaller, there is room to add more memory cells so that the memory system will be a higher capacity.

FIG. 15A depicts word line switch 750 (which is smaller than word line switch 700) for a block that is not selected for erasing. In the example where block 602 is unselected, then word line switch 750 can be any of word line switches 632-638. In this embodiment, the source (ie the cg line) is at 0.5 volts. In this embodiment, the TG line for the unselected block will toggle from zero volts to a high voltage and then back to zero volts. Therefore, the transistor 750 will turn on and then turn off. As a result, the word line at the drain of transistor 750 will first be driven and then it will float.

FIG. 15B shows word line switch 752 (smaller than word line switch 700) which can be any of the word line switches for a block of memory cells selected for erasing (such as word line switches 612-620). In this embodiment, the TG line for the selected block will apply a high voltage to the gate of the word line switches for the selected block. All the global control lines will be applying 0.5 volts such that the word lines for a selected block will be at 0.5 volts.

FIG. 16 is a timing diagram depicting the behavior of the embodiment associated with FIGS. 15A and 15B, which uses a lower voltage across the word lines switches than the embodiment of FIGS. 14A and 14B. In this embodiment, the TG lines for the unselected blocks ($TG_{Unselected}$) will start out VSS at time t0. At time t1, the TG line for unselected blocks will be raised to a high voltage (e.g., 2V-4V). The TG line will continue being ramped up until it reaches the high voltage at time t2. At time t3, the TG line for the unselected blocks will be lowered to Vss, reaching Vss at time t4. The TG for selected blocks ($TG_{Selected}$) will follow TG_unselected until time t3 (i.e start at low and go to high at t2). There are two options 1) Stay at high for the remainder of the time depicted in FIG. 16 or 2) come down at t3 like the TG_unselected, but immediately go high at t4, and then stay high. So the WLselected will go to 0.5V at time t2: same as WL_unselected The Well voltage, starting out at zero volts at time t0, will be raised to an intermediate voltage (Vint) between time t2 and t3 (reaching Vint by t3). At time t4, the voltage of the Well will be ramped up until time t5, when it reaches Vera+0.5 volts. The voltage on the word lines ($WL_{selected}$) of selected blocks will rise to 0.5 volts at t1 and remain at 0.5 volts from t2 to t6. Between time t0 and t1, word lines ($WL_{Unselected}$) for the unselected block will be at zero volts since the TG line for unselected blocks is at zero, causing the word line switches to be off and the word lines to be floating. Between t1 and t4, one or more voltages are applied on the TG lines in order to turn on the word line switches for the unselected blocks; therefore, the word lines for unselected blocks will be driven to 0.5 volts and held there from T2 to T4. As a result, when the Well is ramped up from zero to Vint (between 0.5 and four volts), the word line for the unselected blocks will not couple to the Well and will not ramp up. Rather, the word lines for the unselected blocks will remain at 0.5 volts.

At time t4, the TG lines for the unselected blocks are at zero volts, causing the word lines switches for the unselected blocks to be off and the word lines ($WL_{Unselected}$) for unselected block to be floated. Therefore, when the Well is ramped up from t4 to t5, the word lines for the unselected blocks will be floating such that they will couple to the Well and ramp up with the Well. Since the Well is only ramping up from Vint to Vera plus 0.5 volts, the word lines ($WL_{Unselected}$) for the unselected blocks will only ramp up to Vera+0.5 volts−Vint. The erase operation will happen between times T5 and T6 (and, possibly, after time T6). During that erase operation, the voltage across the word line switches will be Vera−Vint. Therefore, in the embodiment of FIG. 16, the voltage across the word line switches will be lower by Vint than the voltage across the word line switches in the embodiment of FIG. 14. Since the voltage differential across the transistor is smaller, the transistor can be made smaller.

FIG. 17 is a timing diagram describing an erase operation for a different embodiment than FIG. 16. FIG. 17 shows the TG line for the unselected block (Transfer-G), the CG line (same as CGx), CPWELL (same as Well) and a word line WL that is in a block not selected for erasing (same as WLunselected). Initially, all depicted signals are at 0v (ground). At t0, Transfer-G is raised to a High voltage, At t1, CPWELL starts an upward ramp to VERA1 (an intermediate voltage). At t2, Transfer-G is lowered to 0v and CPWELL is maintained at VERA1. At t3, the CG Line is raised from 0v to 0.5v and CPWELL is raised from VERA1 to VERA+0.5v. Because lowering Transfer-G turned off the word line switch, the word line is floating; therefore, at t3 it capacitively couples to the CPWELL and rises up to VERA+0.5v−VERA1 while CPWELL rises from VERA1 to VERA+0.5v.

FIG. 18 depicts two word line switches for the embodiment of FIG. 17. The top word line switch is in an a block not selected for erasing. The TG line (gate signal) varies as depicted in FIG. 17. The bottom word line switch is in a block selected for programming, and the TG line (gate signal) is at a High voltage.

Figure 19:
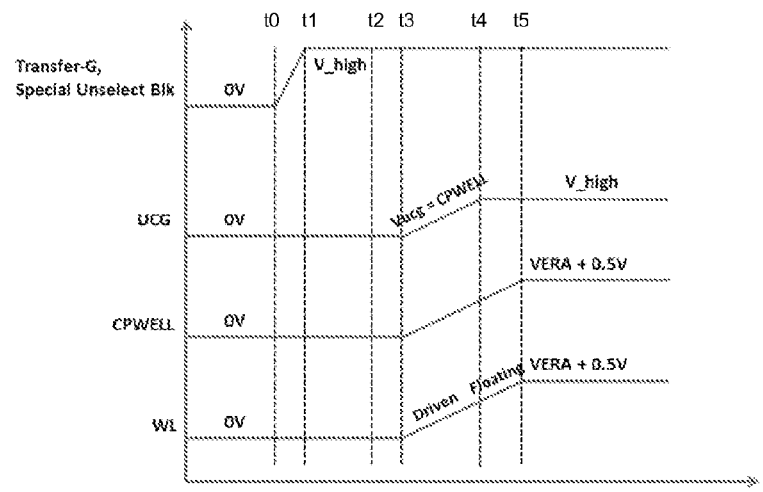
FIGS. 19 and 20 are timing diagrams that describe how to use the proposed scheme in an Shared Row Decoder Architecture.

FIG. 19 shows how prior system using a Shared Row Decoder Architecture operates. In a Shared Row Decoder Architecture, a row decoder is shared by more than one block. FIG. 19 shows the TG line for the unselected block (Transfer-G), the UCG line (same as CGx), CPWELL (same as Well) and a word line WL that is in a block not selected for erasing (same as WLunselected). Initially, all depicted signals are at 0v (ground). At t0, Transfer-G is raised to V_high. At t3, CPWELL starts an upward ramp to VERA+0.5v. Between t3 and t4, UCG is driven with the same voltage as CPWELL so that UCG and CPWELL are raised from 0v to V_high. At t4, UCG is maintained at V_high and CPWELL continues to rise until it reaches VERA+0.5 at t5. Between t3 and t4, the word line switch is on (due to Transfer-G being at V-high) so the voltage of UCG is driven on the word line WL; therefore, the word line WL rises from 0v to V_high. At t4, the word line switch turns off because the control line UCG is at the same voltage as the gate voltage (Transfer-G) of the word line switch; therefore, the word line WL floats, capacitively couples to the well (CPWELL) and rises to VERA+0.5v.

Figure 20:
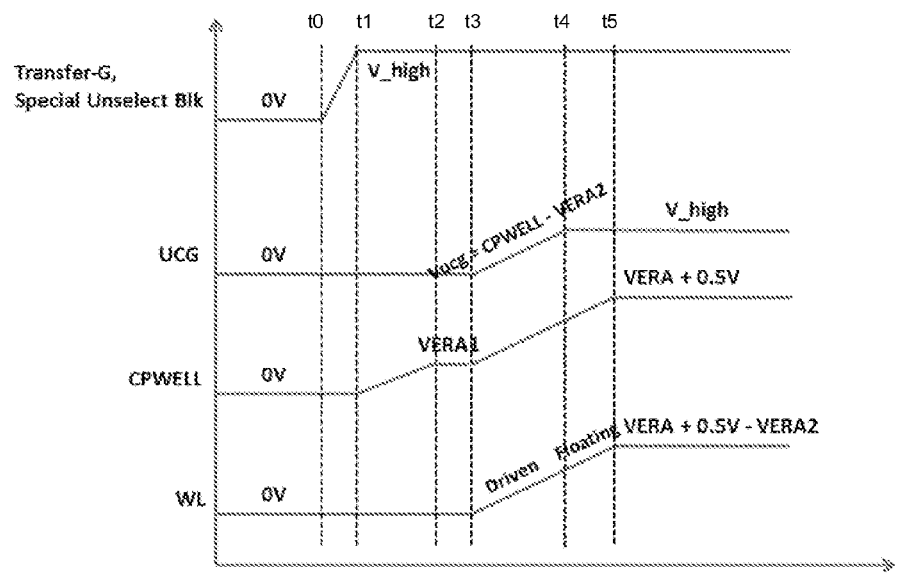

FIG. 20 describes how to use the proposed scheme in an Shared Row Decoder Architecture. FIG. 20 also shows the TG line for the unselected block (Transfer-G), the UCG line (same as CGx), CPWELL (same as Well) and a word line WL that is in a block not selected for erasing (same as WLunselected). Initially, all depicted signals are at 0v (ground). At t0, Transfer-G is raised to V_high. At t1, CPWELL starts an upward ramp to VERA1, reaching VERA1 at t2 and staying at VERA1 until t3. At t3, CPWELL starts an upward ramp from VERA1 to VERA+0.5v, reaching VERA+0.5v at t5. Between t3 and t4, UCG is driven with a voltage equal to CPWELL-VERA2 until it reaches V-high at t4 so that UCG rises concurrently with CPWELL. Note that CPWELL-VERA2 is a rising voltage between t3 and t4. After t4, UCG is maintained at V_high and CPWELL continues to rise until it reaches VERA+0.5 at t5. Between t3 and t4, the word line switch is on (due to Transfer-G being at V_high) so the voltage of UCG is driven on the word line WL; therefore, the word line WL rises from 0v to V_high. At t4, the word line switch turns off because the control line UCG is at the same voltage as the gate voltage (Transfer-G) of the word line switch; therefore, the word line WL floats, capacitively couples to the well (CPWELL) and rises with the well to VERA+0.5v−VERA2.

One embodiment includes a method for operating non-volatile storage, comprising: turning on a first word line switch that connects an unselected word line to a control line, the unselected word line is connected to a first set of non-volatile storage elements that are not to be erased during a current erase operation, the control line is also connected to a selected word line via a second word line switch, the selected word line is connected to a second set of non-volatile storage elements that are to be erased during the current erase operation; applying a first voltage level on the control line while the first word line switch is turned on; raising a well voltage for the first set of non-volatile storage elements and the second set of non-volatile storage elements to an intermediate voltage while the applying the first voltage level on the control line and while the first word line switch is turned on; and raising the well voltage to a particular voltage that is suitable for erasing the second set of non-volatile storage elements while the first word line switch is turned off, the first set of non-volatile storage elements do not erase in response to the well voltage being at the particular voltage.

One embodiment includes a non-volatile storage system, comprising: a control line a first word line; a first word line switch that connects the first word line to the control line; a second word line; a second word line switch that connects the second word line to the control line; a first set of non-volatile storage elements connected to the first word line; a second set of non-volatile storage elements connected to the second word line; a well, the first set of non-volatile storage elements and the second set of non-volatile storage elements are positioned on said well; and one or more control circuits in communication with the control line, first word line switch, and second word line switch, wherein the one or more control circuits turn on the first word line switch and apply a first voltage level on the control line while the first word line switch is turned on, the one or more control circuits raise a well voltage to an intermediate voltage while the applying the first voltage level on the control line and while the first word line switch is turned on, the one or more control circuits raise the well voltage to a particular voltage that is suitable for erasing the second set of non-volatile storage elements while the first word line switch is turned off, the first set of non-volatile storage elements do not erase in response to the well voltage being at the particular voltage.

One embodiment includes a method for operating non-volatile storage, comprising: turning on a first word line switch that connects an unselected word line to a control line, the unselected word line is connected to a first set of non-volatile storage elements that are not to be erased during a current erase operation, the control line is also connected to a selected word line via a second word line switch, the selected word line is connected to a second set of non-volatile storage elements that are to be erased during the current erase operation; applying a first voltage on the control line while the first word line switch is turned on so that the first voltage transfers to the first word line; raising a well voltage for the first set of non-volatile storage elements and the second set of non-volatile storage elements to an intermediate voltage while the first word line is at the first voltage and the first word line switch is turned on; turning off the first word line switch when the well voltage is at the intermediate voltage so that the unselected word line floats; and after the first word line switch is turned off and while the unselected word line floats, raising the well voltage from the intermediate voltage to a particular voltage that is suitable for erasing the second set of non-volatile storage elements, the first set of non-volatile storage elements do not erase in response to the well voltage being at the particular voltage.

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

We claim:

1. A method for operating non-volatile storage, comprising:
   prior to erasure, maintaining voltages of word lines and a well voltage of a well on which non-volatile storage elements are formed and connected to the word lines, at a same starting voltage;
   at the start of erasure, temporarily turning on a first word line switch that connects an unselected one of the word lines to a global control line, where the unselected word line is connected to a first set of the non-volatile storage elements that are not to be erased during a current erase operation, where the global control line is also connected to a selected one of the word lines via a turned-on second word line switch, where the selected word line is connected to a second set of the non-volatile storage elements that are to be erased during the current erase operation;
   applying an above ground first voltage on the global control line at least after the first word line switch is temporarily turned on;
   raising the well voltage for the first set of non-volatile storage elements and the second set of non-volatile storage elements from the starting voltage to the first voltage and then to an intermediate voltage level that is less than an erasure suitable voltage while the first word line switch is still temporarily turned on; and
   turning off the first word line switch and raising the well voltage above the intermediate voltage level and to a particular voltage that is suitable for erasing the second set of non-volatile storage elements while the first word line switch is turned off and its unselected word line therefore floats, wherein due to the floating of the unselected word line the first set of non-volatile storage elements do not erase in response to the well voltage being at the particular voltage.

2. The method of claim 1, wherein:
the first voltage is a positive voltage and the starting voltage is ground potential.

3. The method of claim 1, wherein:
the turning off of the first word line switch includes applying a gate voltage to the first word line switch that is less than the first voltage.

4. The method of claim 3, wherein:
the turning off of the first word line switch includes lowering the gate voltage for the first word line switch to ground potential.

5. The method of claim 4, wherein:
the raising the well voltage comprises raising the well voltage from the intermediate voltage level to the particular voltage after turning off the first word line switch by said lowering of the gate voltage for the first word line switch.

6. The method of claim 5, wherein:
the turning off the first word line switch causes the unselected word line to float and capacitively couple to the well thereby causing the unselected word line to have a voltage that rises in response to the raising of the well voltage.

7. The method of claim 6, wherein:
the unselected word line rises up to the well voltage less the intermediate voltage level in response to the raising of the well voltage.

8. The method of claim 3, wherein:
the first voltage is a first positive voltage, the particular voltage that is suitable for erasing is equal to a sum of an erase voltage and the first positive voltage, and due to capacitive coupling between the unselected word line and the well, the unselected word line rises to the sum of the erase voltage and the first positive voltage less the intermediate voltage in response to the raising of the well voltage.

9. The method of claim 4, wherein:
the unselected word line and the first set of non-volatile storage elements are in an unselected block of non-volatile storage elements that are not erased in response to the well voltage being at the particular voltage, the selected word line and the second set of non-volatile storage elements are in a selected block of non-volatile storage elements that are erased in response to the well voltage being at the particular voltage, the global control line connects to the selected block and the unselected block.

10. The method of claim 3, further comprising:
using a charge pump for applying the above ground first voltage on the global control line; and
turning off the second word line switch when the first word line switch is turned off, and then turning the second word line switch back on when raising the well voltage from the intermediate voltage to the particular voltage, having the second word line switch turned on when raising the well voltage from the intermediate voltage to the particular voltage so as to thereby allow the selected word line to be at the first voltage while the well voltage rises to the particular voltage thereby providing a condition suitable for erasing the second set of non-volatile storage elements.

11. The method of claim 4, wherein:
the turning off the first word line switch is performed after the well voltage is raised to the intermediate voltage.

12. The method of claim 4, wherein:
the well voltage is held at the intermediate voltage for a finite period of time, the turning off the first word line switch is performed during the finite period of time.

13. The method of claim 1, further comprising:
before applying the above ground first voltage on the global control line, applying a ground potential on the global control line and then raising the control line to the higher first voltage after raising the well voltage to the intermediate voltage level, the first voltage is a lower voltage than the particular voltage.

14. The method of claim 13, wherein:
the raising the well voltage comprises raising the well voltage from the intermediate voltage level to the particular voltage; and
the control line is raised to the first voltage concurrently with raising the well voltage from the intermediate voltage level.

15. The method of claim 14, further comprising:
turning off the first word line switch in response to the control line reaching the first voltage, the first word line switch having a gate input at the higher voltage, prior to the control line reaching the first voltage the unselected word line has a rising voltage driven by the control line, subsequent to the control line reaching the first voltage the unselected word line has a rising voltage due to the unselected word line coupling to the well.

16. The method of claim 14, further comprising:
turning off the first word line switch in response to the control line reaching a sufficient voltage with respect to a gate input of the first word line switch, prior to the turning off the first word line switch the unselected word line has a rising voltage driven by the control line, subsequent to the turning off the first word line switch the unselected word line has a rising voltage due to the unselected word line coupling to the well.

17. A non-volatile storage system, comprising:
a global control line
a first word line;
a first word line switch configured to selectively connect the first word line to the global control line;
a second word line;
a second word line switch configured to selectively connect the second word line to the global control line;
a first set of non-volatile storage elements connected to the first word line;
a second set of non-volatile storage elements connected to the second word line;
a well, the first set of non-volatile storage elements and the second set of non-volatile storage elements are positioned on said well; and
one or more control circuits in communication with the well, the global control line, the first word line switch, and the second word line switch,
wherein the one or more control circuits are configured to keep the well, the first word line and the second word line at a same starting voltage prior to an erasure operation;
wherein the one or more control circuits are configured to temporarily turn on the first word line switch at the start of a current erasure operation and apply an above ground first voltage on the global control line at least after the first word line switch is turned on, the one or more control circuits are further configured to raise a well voltage of the well from the starting voltage to the first voltage and then to an intermediate voltage while the first word line switch is turned on, the one or more control circuits are additionally configured to turn off the first word line switch and raise the well voltage to a particular voltage that is suitable for erasing the second set of non-volatile storage elements while the first word line switch is turned off, wherein the first set of non-volatile storage elements do not erase in response to the well voltage being at the particular voltage.

18. The non-volatile storage system of claim 17, wherein:
the one or more control circuits include a first block address decoder, a first level shifter in communication with the first block address decoder, a second block address decoder, and a second level shifter in communication with the second block address decoder;
the first level shifter provides selection signal to the first word line switch; and
the second level shifter provides selection signal to the second word line switch.

19. The non-volatile storage system of claim 17, wherein:
the first set of non-volatile storage elements and the second set of non-volatile storage elements are NAND flash memory devices.

20. The non-volatile storage system of claim 17, wherein:
the one or more control circuits turn off the first word line switch by lowering a gate voltage for the first word line switch, the turning off of the first word line switch causes the first word line to float and capacitively couple to the well thereby causing the first word line to have a voltage that raises up in response to raising of the well voltage.

21. The non-volatile storage system of claim 20, wherein:
the raising of the well voltage comprises raising the well voltage from the intermediate voltage to the particular voltage after turning off the first word line switch by lowering the gate voltage for the first word line switch.

22. The non-volatile storage system of claim 20, wherein:
the first word line raises up to the well voltage less the intermediate voltage in response to the raising of the well voltage.

23. The non-volatile storage system of claim 20, wherein:
the turning off the first word line switch is performed after the well voltage is raised to the intermediate voltage.

24. The non-volatile storage system of claim 17, wherein:
the one or more control circuits raise the control line from the first voltage level to a higher voltage level after raising the well voltage to the intermediate voltage, the higher voltage level is a lower voltage than the particular voltage.

25. The non-volatile storage system of claim 24, wherein:
the raising of the well voltage comprises raising the well voltage from the intermediate voltage to the particular voltage; and
the control line is raised from the first voltage level to the higher voltage level concurrently with raising the well voltage from the intermediate voltage.

26. The non-volatile storage system of claim 25, wherein:
the one or more control circuit turn off the first word line switch in response to the control line reaching a sufficient voltage with respect to a gate input of the first word line switch, prior to the turning off the first word line switch the first word line has a rising voltage driven by the control line, subsequent to the turning off the first word line switch the first word line has a rising voltage due to the unselected word line coupling to the well.

27. A method for operating non-volatile storage, comprising:
prior to an erasure operation, maintaining voltages of word lines and a well voltage of a well on which non-volatile storage elements are formed and connected to the word lines, at a same starting voltage;
temporarily turning on a first word line switch that connects an unselected one of the word lines to a control line, where the unselected word line is connected to a first set of the non-volatile storage elements that are not to be erased during a current erase operation, where the control line is also connected to a selected one of the word lines via a second word line switch, where the selected word line is connected to a second set of the non-volatile storage elements that are to be erased during the current erase operation;
applying a first voltage on the control line at least after the first word line switch is turned on so that the first voltage transfers to the first word line;
raising the well voltage for the first set of non-volatile storage elements and the second set of non-volatile storage elements to an intermediate voltage while the first word line switch is turned on;
turning off the first word line switch when the well voltage is at the intermediate voltage so that the unselected word line floats; and
after the first word line switch is turned off and while the unselected word line floats, raising the well voltage from the intermediate voltage to a particular voltage that is suitable for erasing the second set of non-volatile storage elements, where the first set of non-volatile storage elements do not erase in response to the well voltage being at the particular voltage.

28. The method of claim 27 wherein:
the applying of the first voltage on the control line occurs before the first word line switch is turned on.

29. The method of claim 1 wherein:
the applying of the first voltage on the global control line occurs before the first word line switch is turned on.

* * * * *